United States Patent
Nguyen et al.

(10) Patent No.: US 9,653,126 B2
(45) Date of Patent: May 16, 2017

(54) DIGITAL RAMP RATE CONTROL FOR CHARGE PUMPS

(71) Applicant: SANDISK TECHNOLOGIES INC., Plano, TX (US)

(72) Inventors: Qui Vi Nguyen, San Jose, CA (US); Steve Choi, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/520,320

(22) Filed: Oct. 21, 2014

(65) Prior Publication Data
US 2015/0213844 A1 Jul. 30, 2015

Related U.S. Application Data

(60) Provisional application No. 61/932,194, filed on Jan. 27, 2014.

(51) Int. Cl.
| | | |
|---|---|---|
| G11C 5/14 | (2006.01) | |
| H03K 4/02 | (2006.01) | |
| G11C 13/00 | (2006.01) | |

(52) U.S. Cl.
CPC .......... *G11C 5/145* (2013.01); *G11C 13/0038* (2013.01); *H03K 4/023* (2013.01); *G11C 2013/0092* (2013.01)

(58) Field of Classification Search
CPC ..... G11C 5/145; G11C 13/0038; H03K 4/023
USPC .......................................................... 365/226
See application file for complete search history.

(56) References Cited

U.S. PATENT DOCUMENTS

| | | | | |
|---|---|---|---|---|
| 7,512,008 | B2* | 3/2009 | Chan | G11C 16/12 |
| | | | | 365/185.14 |
| 7,586,362 | B2 | 9/2009 | Pan | |
| 7,795,952 | B2* | 9/2010 | Lui | G11C 5/145 |
| | | | | 327/536 |
| 8,699,247 | B2 | 4/2014 | Nguyen | |
| 2011/0044090 | A1 | 2/2011 | Terada | |
| 2011/0044097 | A1 | 2/2011 | Chen | |
| 2011/0201779 | A1 | 8/2011 | Cherian | |

(Continued)

FOREIGN PATENT DOCUMENTS

EP 2424094 2/2012

OTHER PUBLICATIONS

PCT International Search Report and Written Opinion of the International Searching Authority dated Apr. 17, 2015, PCT Patent Application No. PCT/US2015/011264.

*Primary Examiner* — Tri Hoang
(74) *Attorney, Agent, or Firm* — Vierra Magen Marcus LLP

(57) ABSTRACT

Methods for controlling a ramp rate of an output voltage derived from one or more charge pumps and reducing variation in the ramp rate due to process, voltage, and temperature (PVT) variations are described. In some embodiments, the ramp rate of the output voltage from one or more charge pumps may be controlled using a ramp rate control circuit that uses a digital counter to adjust (or step up) the output voltage from the one or more charge pumps based on a ramp rate schedule. The ramp rate schedule may specify varying output voltage levels for the one or more charge pumps during a time period in which the output voltage charges up from a first voltage to a second voltage greater than the first voltage.

20 Claims, 19 Drawing Sheets

(56) References Cited

U.S. PATENT DOCUMENTS

| | | | |
|---|---|---|---|
| 2012/0140563 A1* | 6/2012 | Sung | G06F 1/10 |
| | | | 365/185.18 |
| 2013/0193944 A1* | 8/2013 | Suzuki | G11C 5/145 |
| | | | 323/298 |
| 2013/0265828 A1 | 10/2013 | Cunningham | |

* cited by examiner

US 9,653,126 B2

DIGITAL RAMP RATE CONTROL FOR CHARGE PUMPS

CLAIM OF PRIORITY

The present application claims priority to U.S. Provisional Application No. 61/932,194, entitled "Digital Ramp Rate Control For Charge Pumps System With Small Variation And Reduce Power Consumption," filed Jan. 27, 2014, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in transistor characteristics over process, voltage, and temperature variations.

DETAILED DESCRIPTION

Figure 1A:
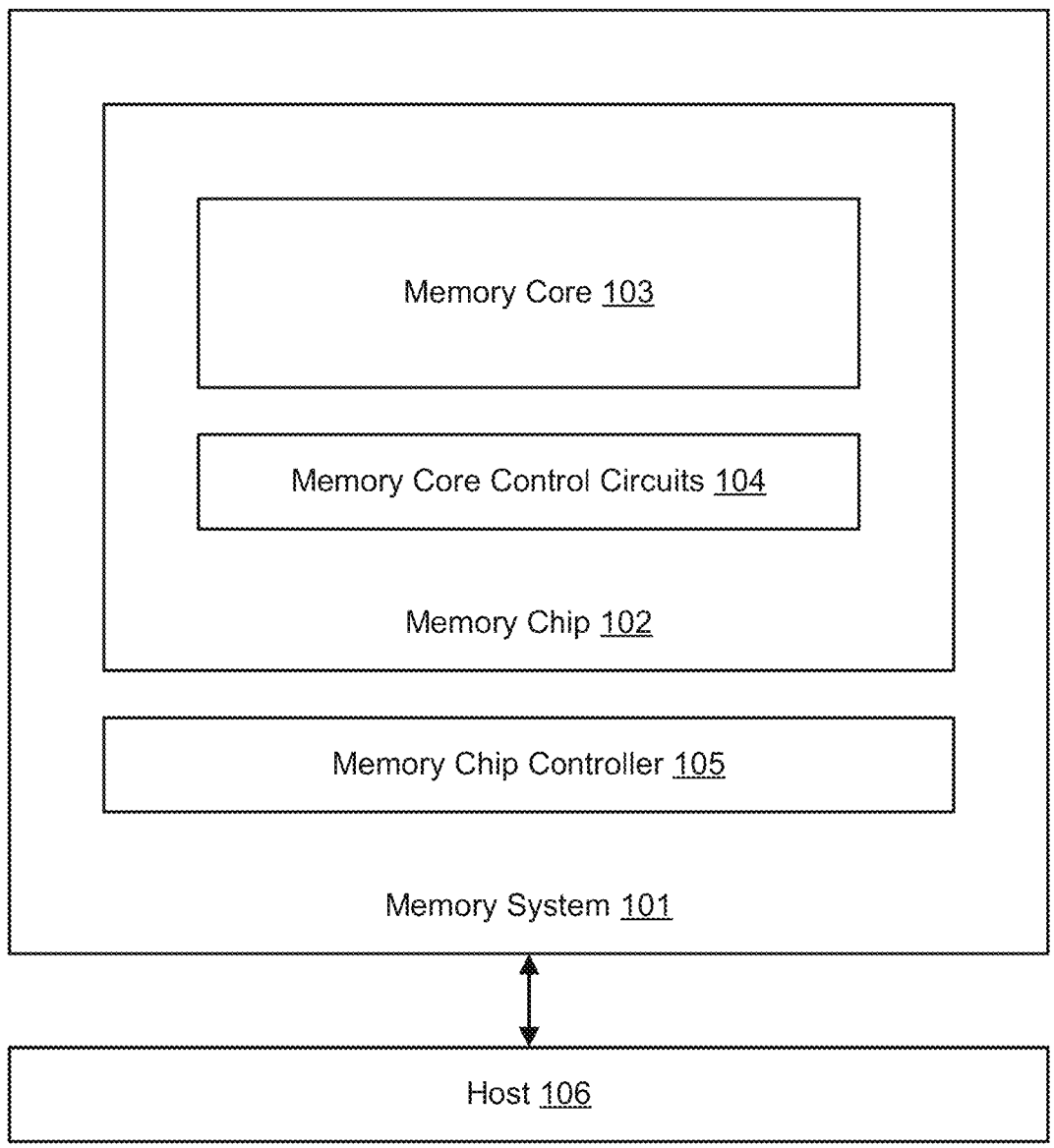
FIG. 1A depicts one embodiment of a memory system and a host.

Technology is described for controlling a ramp rate of an output voltage derived from one or more charge pumps and reducing variation in the ramp rate due to process, voltage, and temperature (PVT) variations. The ramp rate may correspond with a charge up rate at which the output voltage charges up from a first voltage to a second voltage greater than the first voltage. In some embodiments, the ramp rate of the output voltage from one or more charge pumps may be controlled using a ramp rate control circuit that uses a digital counter to adjust (or step up) the output voltage from the one or more charge pumps based on a ramp rate schedule. The ramp rate schedule may specify varying output voltage levels for the one or more charge pumps during a time period in which the output voltage charges up from a first voltage to a second voltage greater than the first voltage. In one example, the ramp rate schedule may include a plurality of times, each time of the plurality of times may correspond with a different output voltage level for the one or more charge pumps. The ramp rate schedule may be used to control the ramp rate of the output voltage from the one or more pumps and the final regulated voltage from the one or more charge pumps.

In some cases, the ramp rate schedule may be implemented using a ramp rate control circuit that uses a binary counter (e.g., derived from a PVT insensitive clock signal) to determine a particular time, a lookup table associated with the ramp rate schedule (e.g., stored in a non-volatile memory) to determine a particular voltage level that corresponds with the particular time, and a state machine to determine control signals to be sent to the one or more charge pumps. The ramp rate control circuit may use a comparator to detect that a particular voltage level has been exceeded. In response to detecting that the particular voltage level has been exceeded, the ramp rate control circuit may send a feedback flag to disable (or temporarily suspend) the charge pumps from further charging up the output of the one or more charge pumps. The ramp rate control circuit may adjust an internal voltage reference used for regulating the output voltage of the one or more charge pumps based on the ramp rate schedule.

In one embodiment, the final regulated voltage from the one or more charge pumps may depend on a type of memory operation being performed on a memory array. The memory array may comprise a NAND memory array, a 3D NAND memory array (e.g., a bit cost scalable (BiCS) NAND structure), or a three-dimensional memory array (e.g., a 3D ReRAM memory array). In one example, if the memory operation comprises a programming operation, then the final regulated voltage may comprise a first high voltage (e.g., 10V) that may be used for generating a programming voltage (e.g., 7V) or an unselected word line voltage (e.g., 6.5V) to be used for biasing control lines (e.g., word lines and/or bit lines) during the programming operation. In another example, if the memory operation comprises a read operation, then the final regulated voltage may comprise a second high voltage (e.g., 6V) that may be used for generating a read voltage (e.g., 4V) or an unselected word line voltage (e.g., 3.5V). The ramp rate (or the slope at which the output voltage of the one or more charge pumps charges up to a final regulated voltage) may be substantially the same for both the programming operation and the read operation. In some cases, the ramp rate may be steeper (e.g., associated with a faster charge up) for a first memory operation (e.g., a read operation) and less steep (e.g., associated with a slower charge up) for a second memory operation (e.g., a programming operation).

In some embodiments, the ramp rate schedule may be used to control the frequency of voltage steps that occur to the output voltage from the one or more charge pumps over time. In one example, the ramp rate schedule may specify that a first ramp rate slope be applied to the output voltage between a first time and a second time and that a second ramp rate slope different from the first ramp rate slope be applied to the output voltage between the second time and a third time. In some cases, the second ramp rate slope may be less steep than the first ramp rate slope. In other cases, the second ramp rate slope may be steeper than the first ramp rate slope.

The benefits of controlling the ramp rate of an output voltage of a charge pump using a binary counter to determine when to step up the output voltage include reduced variation in the ramp rate due to PVT variations. The benefits also include the ability to implement different ramp rate slopes to compensate for varying output load conditions or varying device characteristics over different output voltage levels.

The output voltage of the one or more charge pumps may be used to generate various voltages used for biasing word lines and/or bit lines of a memory array. The output voltage of the one or more charge pumps may be used to as a power supply for a non-inverting amplifier and a unity gain buffer to generate a regulated voltage. In one example, the output voltage may be used to generate an unselected word line voltage to be applied to one or more unselected word lines of a memory array during a programming operation. The output voltage may also be used to generate a programming voltage to be applied to a selected word line during a programming operation.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

FIG. 1A depicts one embodiment of a memory system 101 and a host 106. The memory system 101 may comprise a non-volatile storage system interfacing with the host (e.g., a mobile computing device). In some cases, the memory system 101 may be embedded within the host 106. In other cases, the memory system 101 may comprise a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
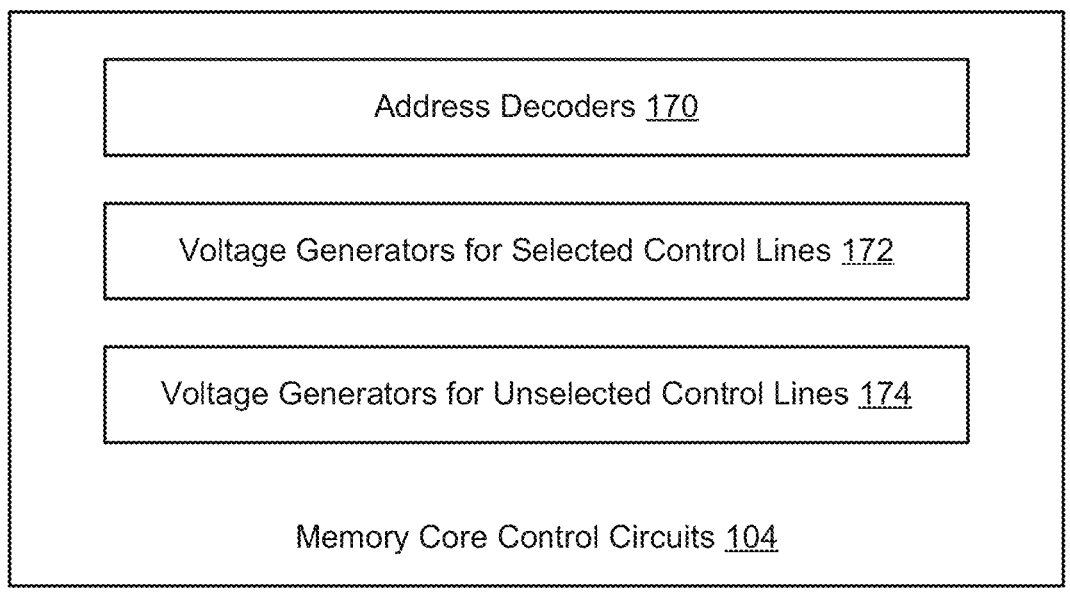
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
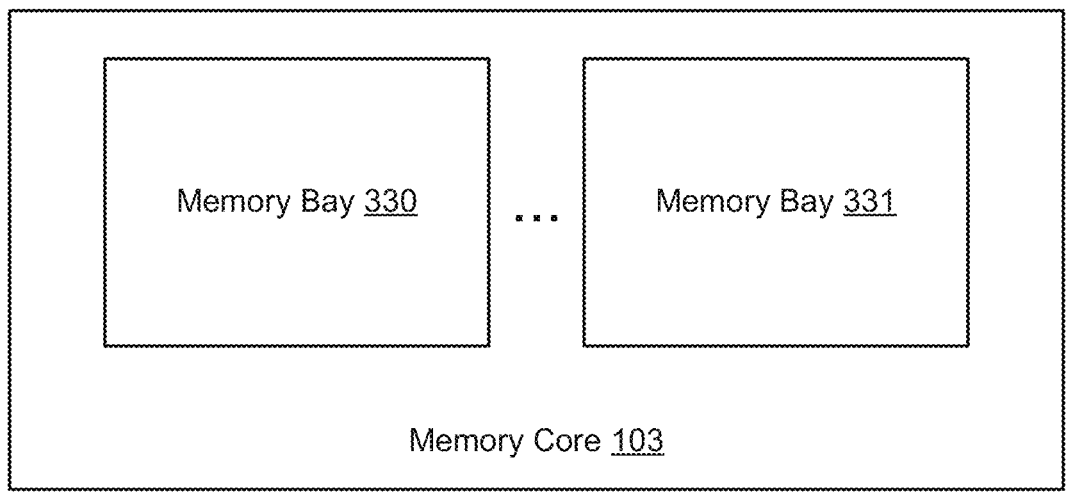
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
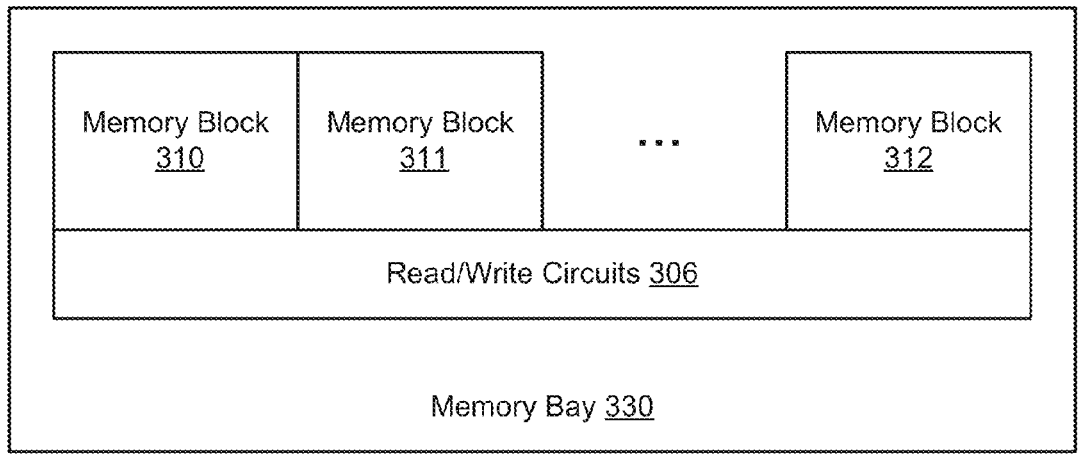
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
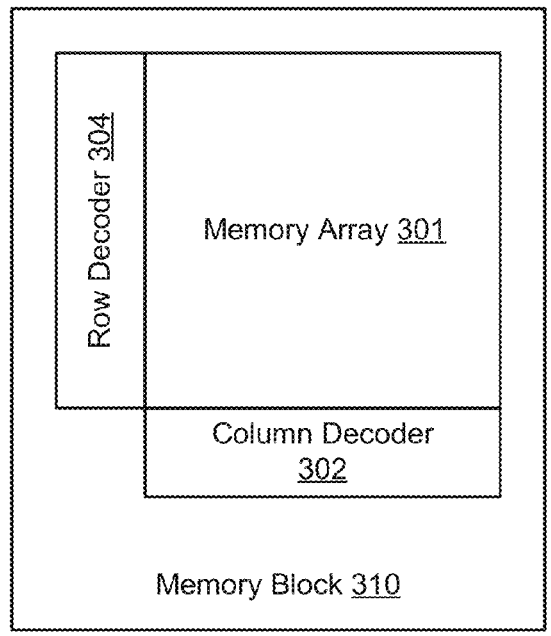
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
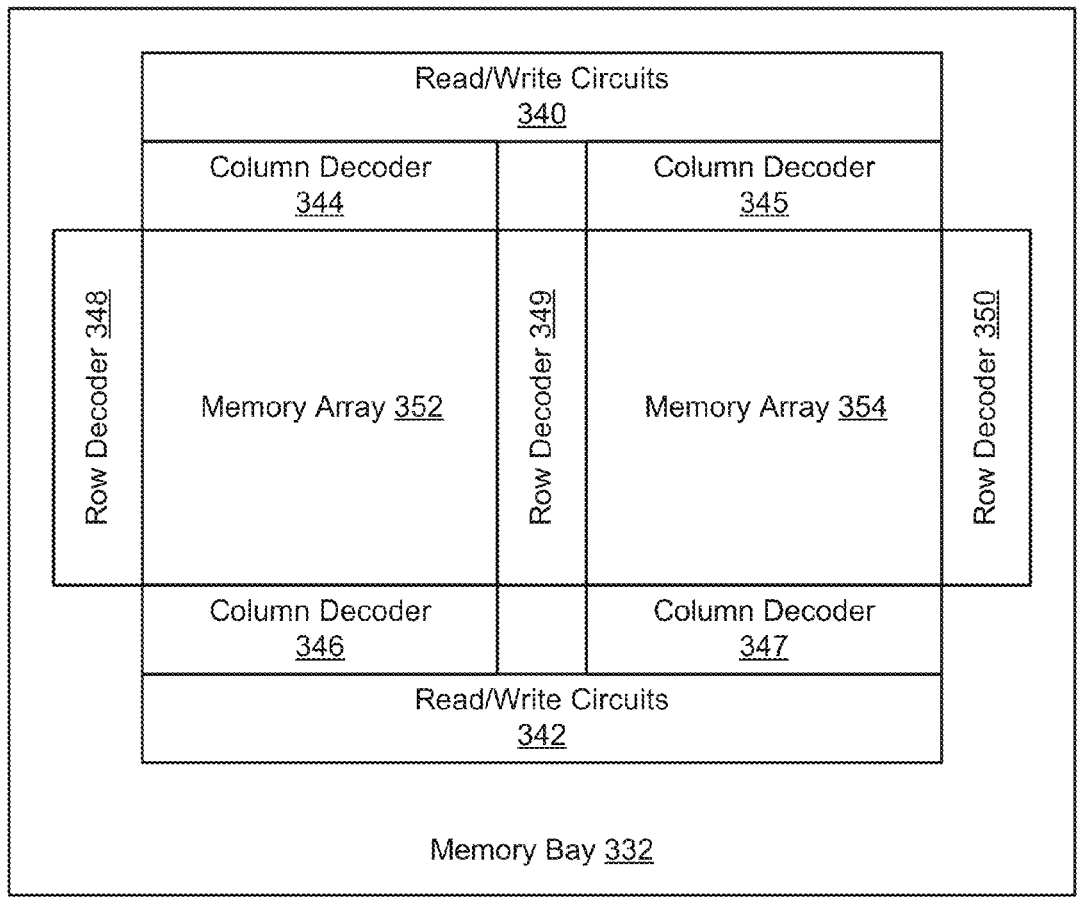
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
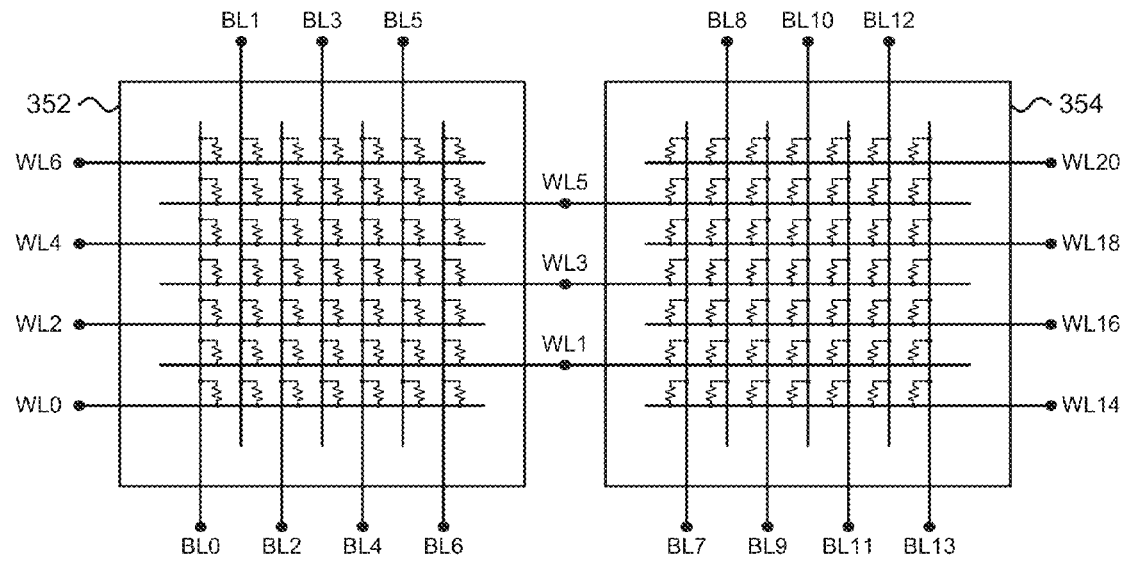
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate).

Figure 2B:
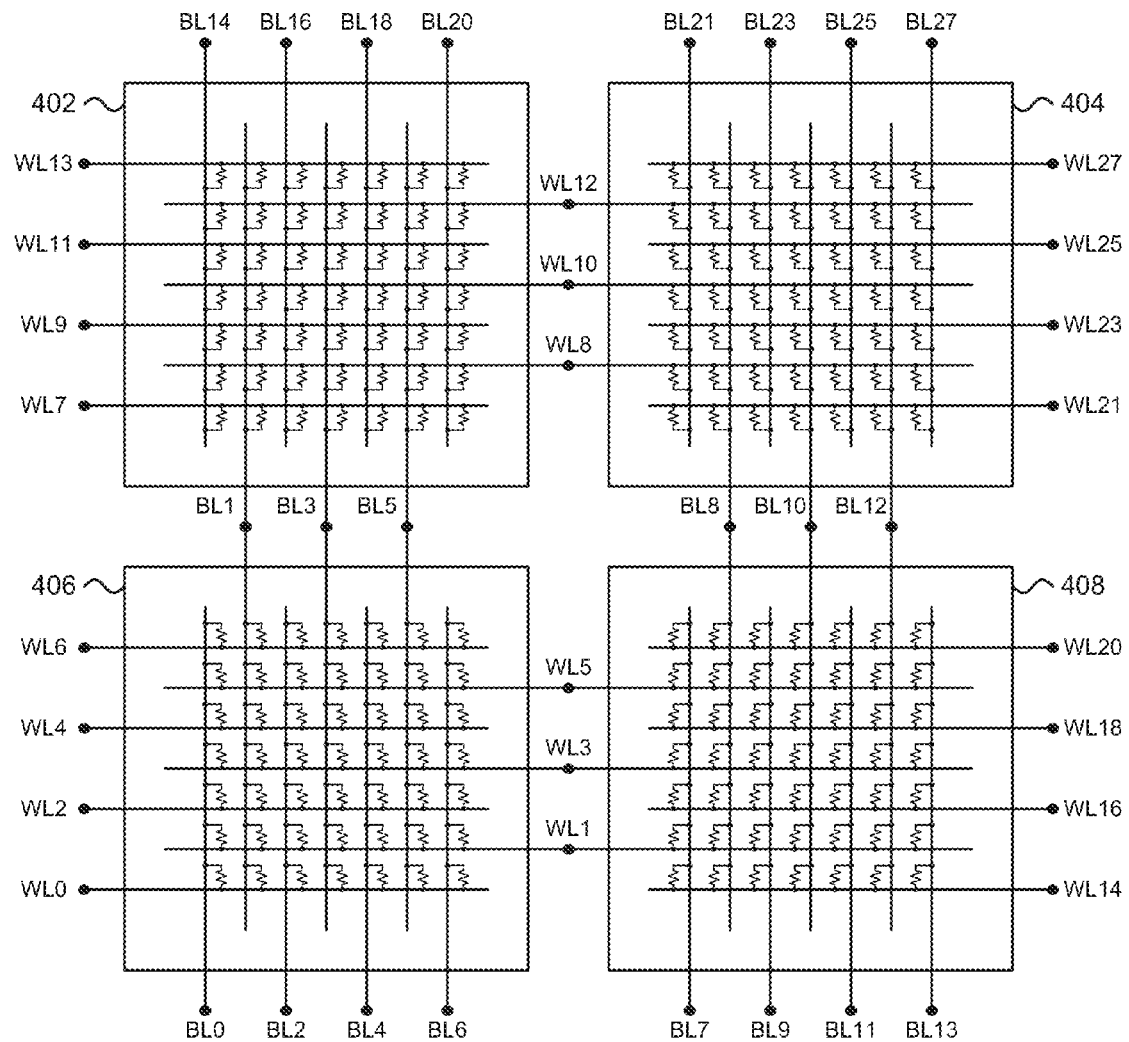
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
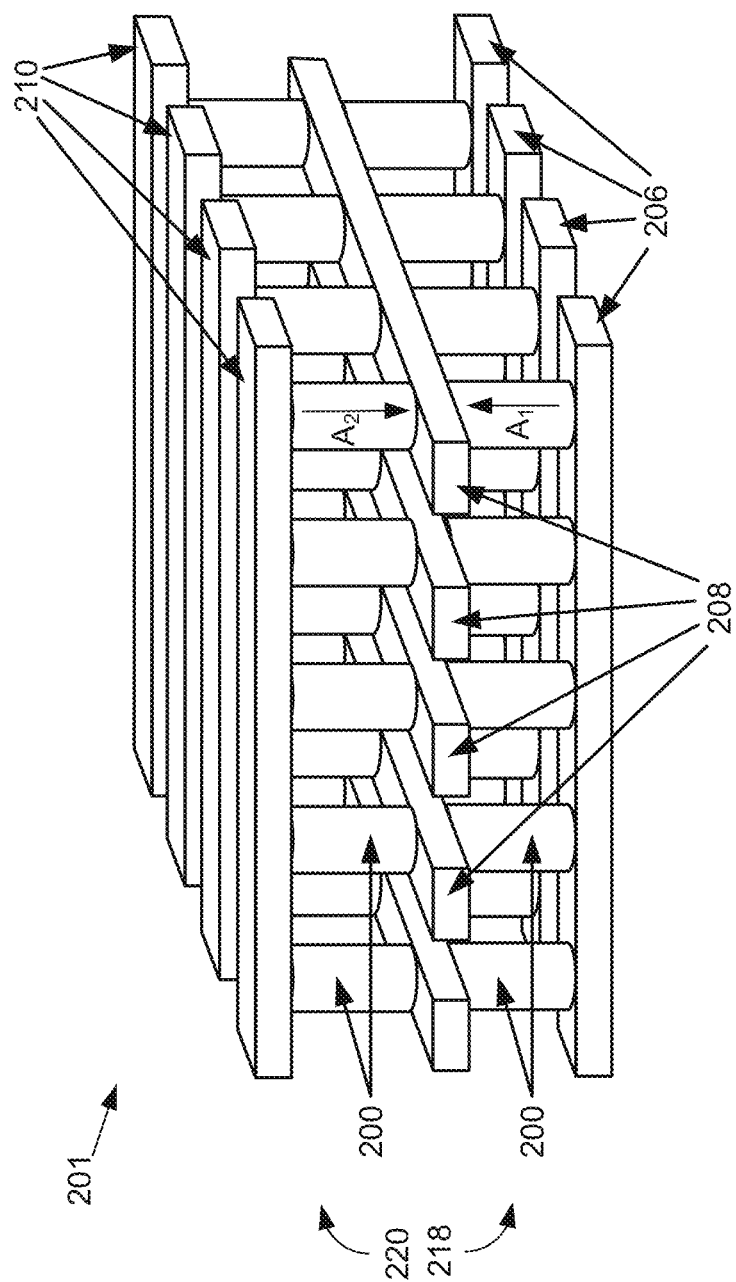
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
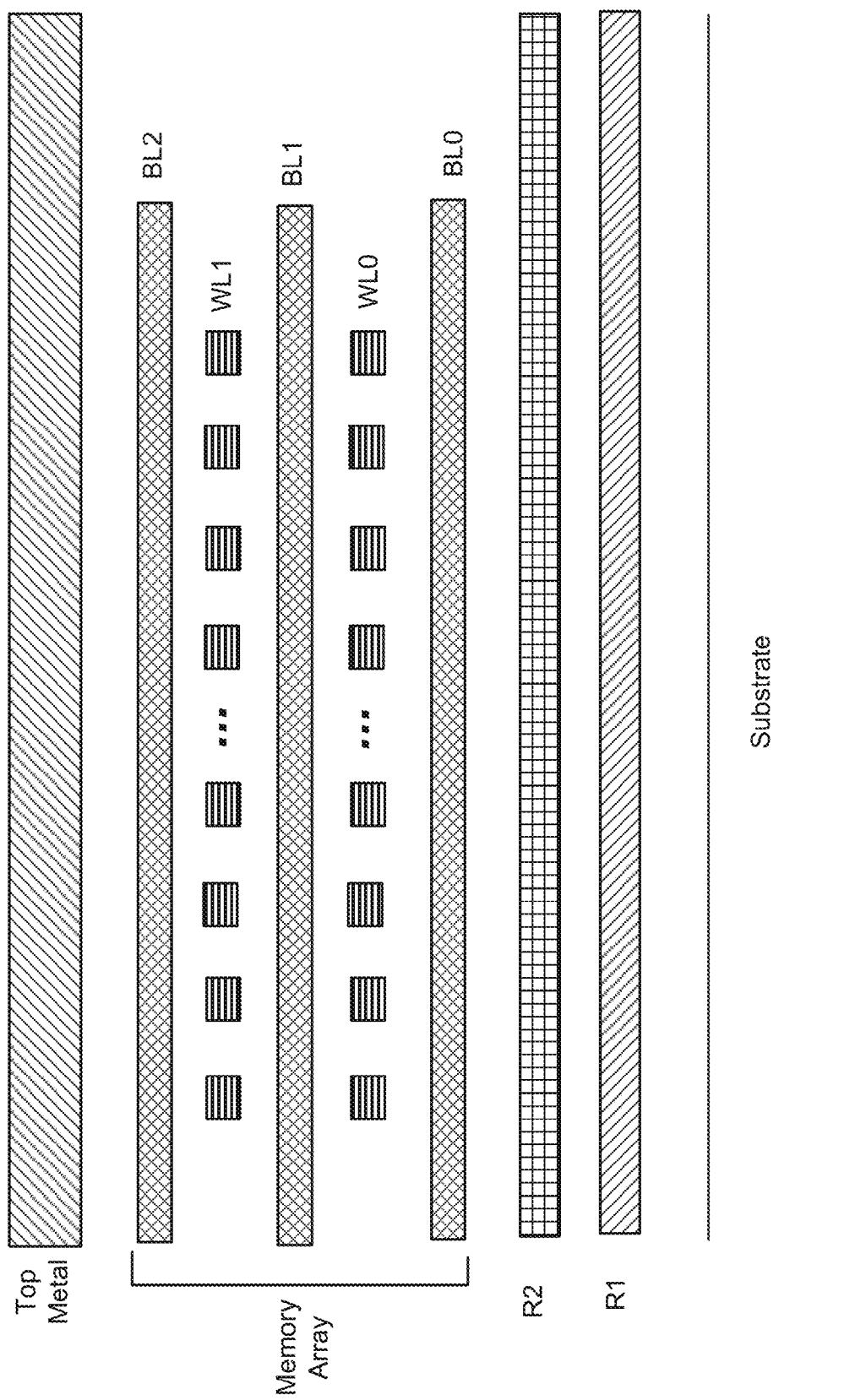
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
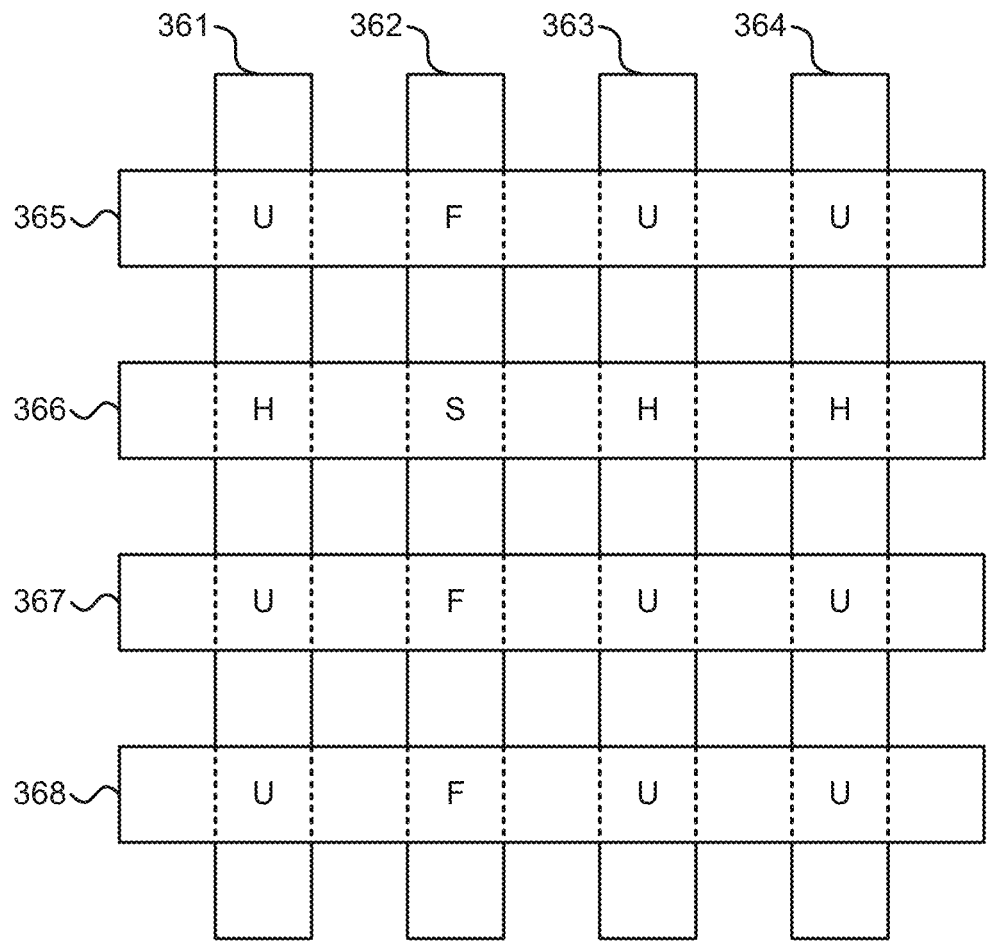
FIGS. 3C-3D depicts various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
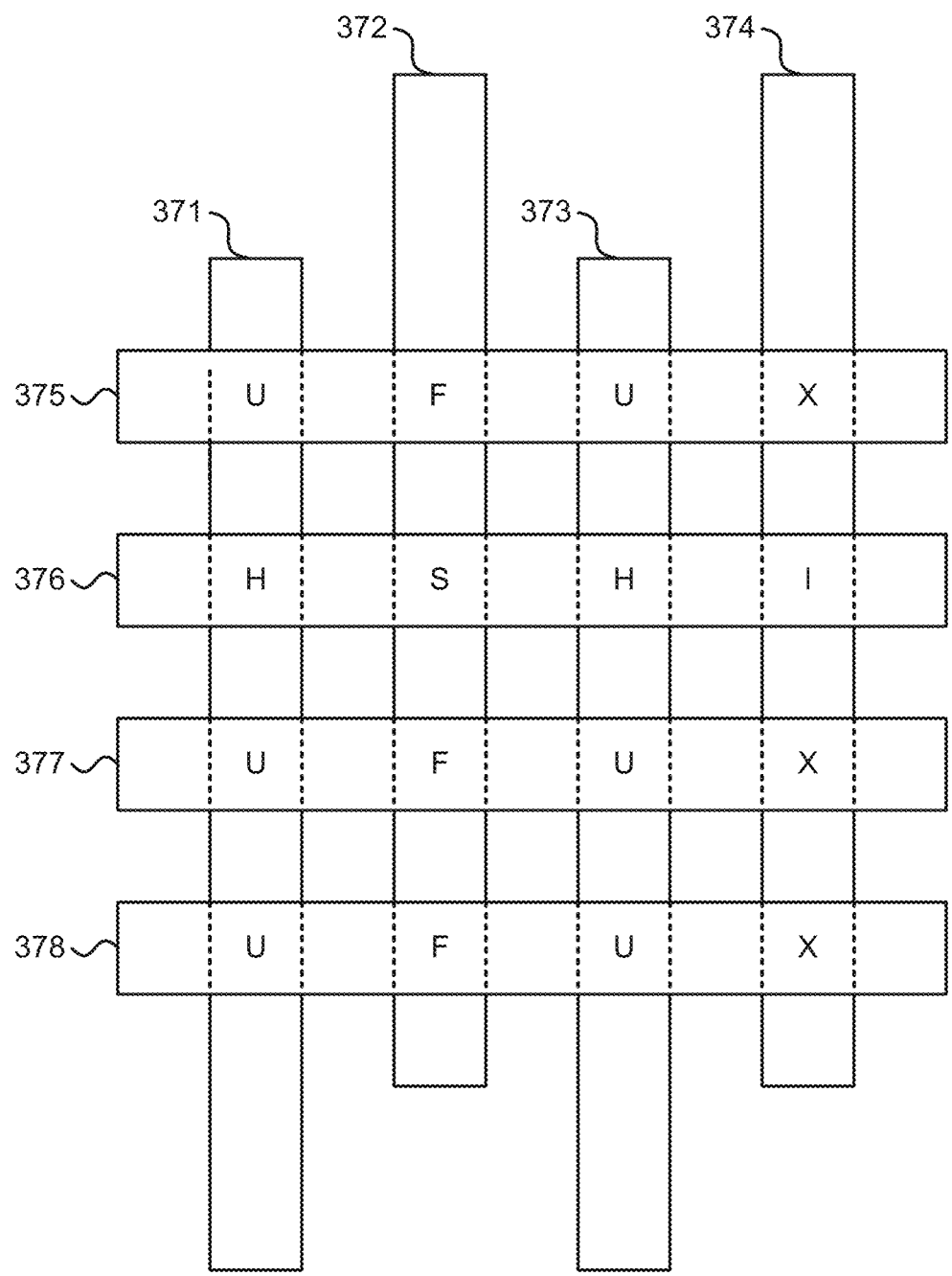

FIG. 3D depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
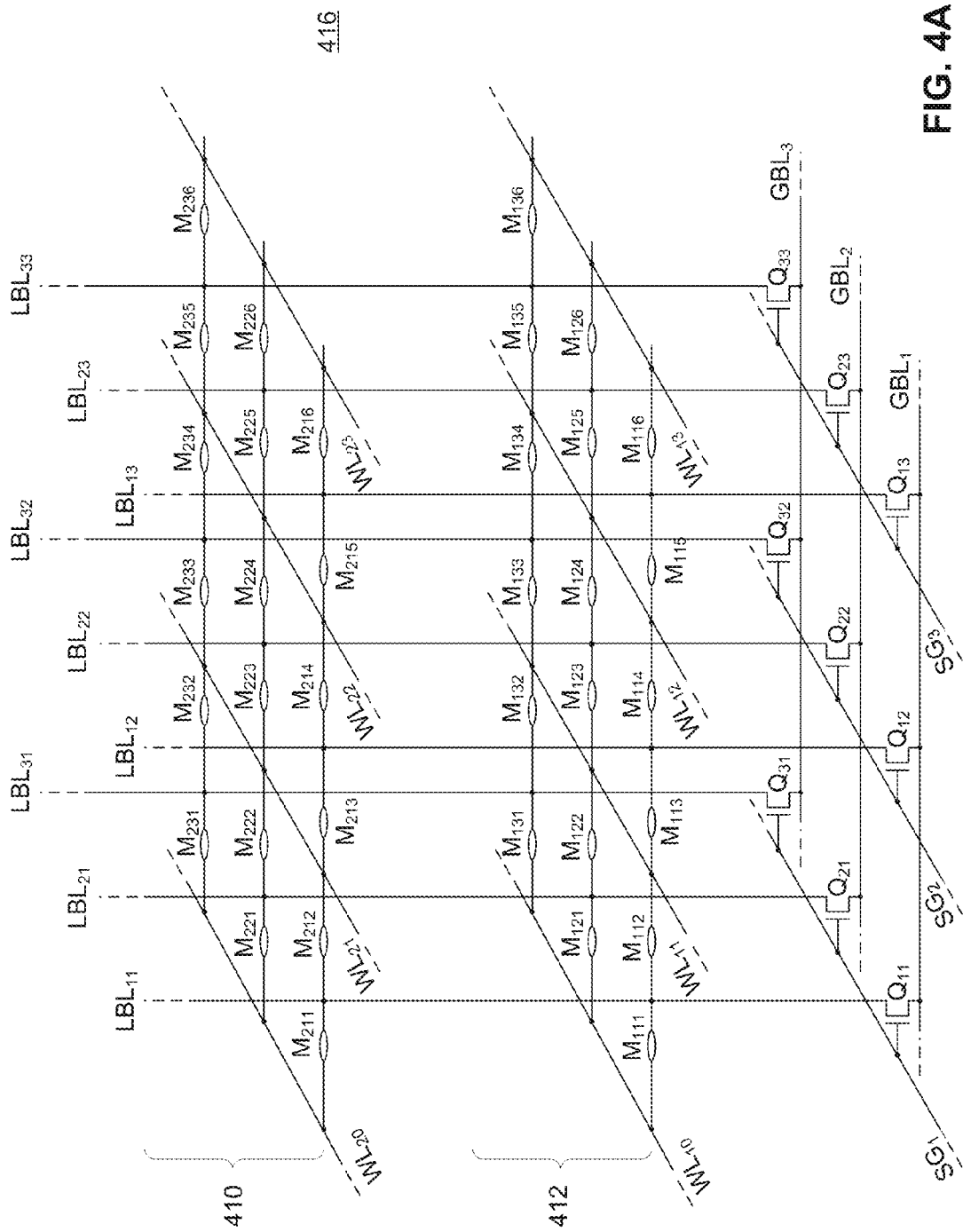
FIG. 4A depicts one embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{31}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
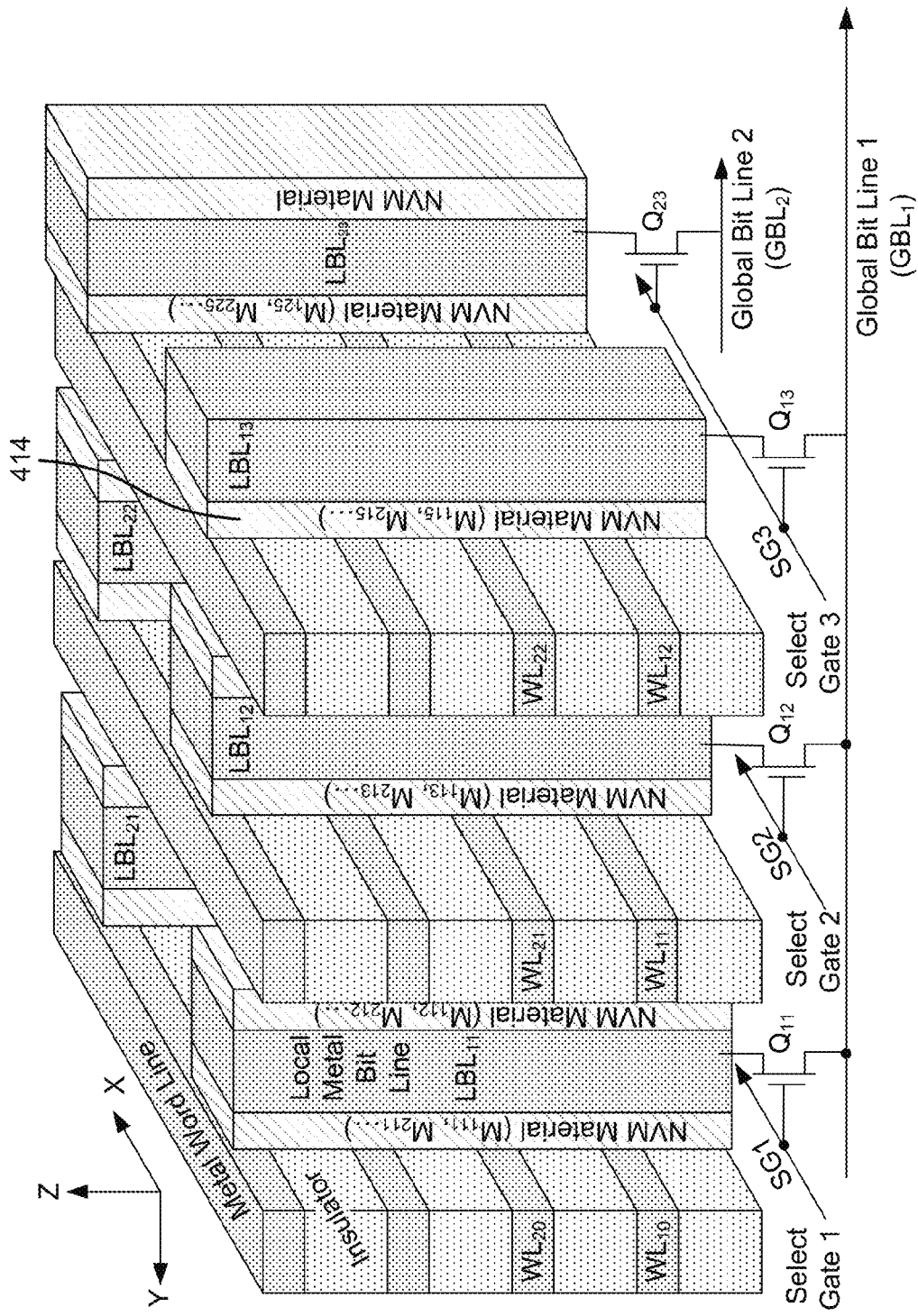
FIG. 4B depicts one embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical TFT.

More information regarding the structure and operation of vertical bit line memory arrays may be found in U.S. Provisional Application 61/423,007, entitled "Non-Volatile Memory Having 3D Array of Read/Write Elements With Vertical Bit Lines and Laterally Aligned Active Elements and Methods Thereof" and U.S. patent application Ser. No. 13/323,703, entitled "Three Dimensional Non-Volatile Storage with Three Device Driver for Row Select."

Figure 5:
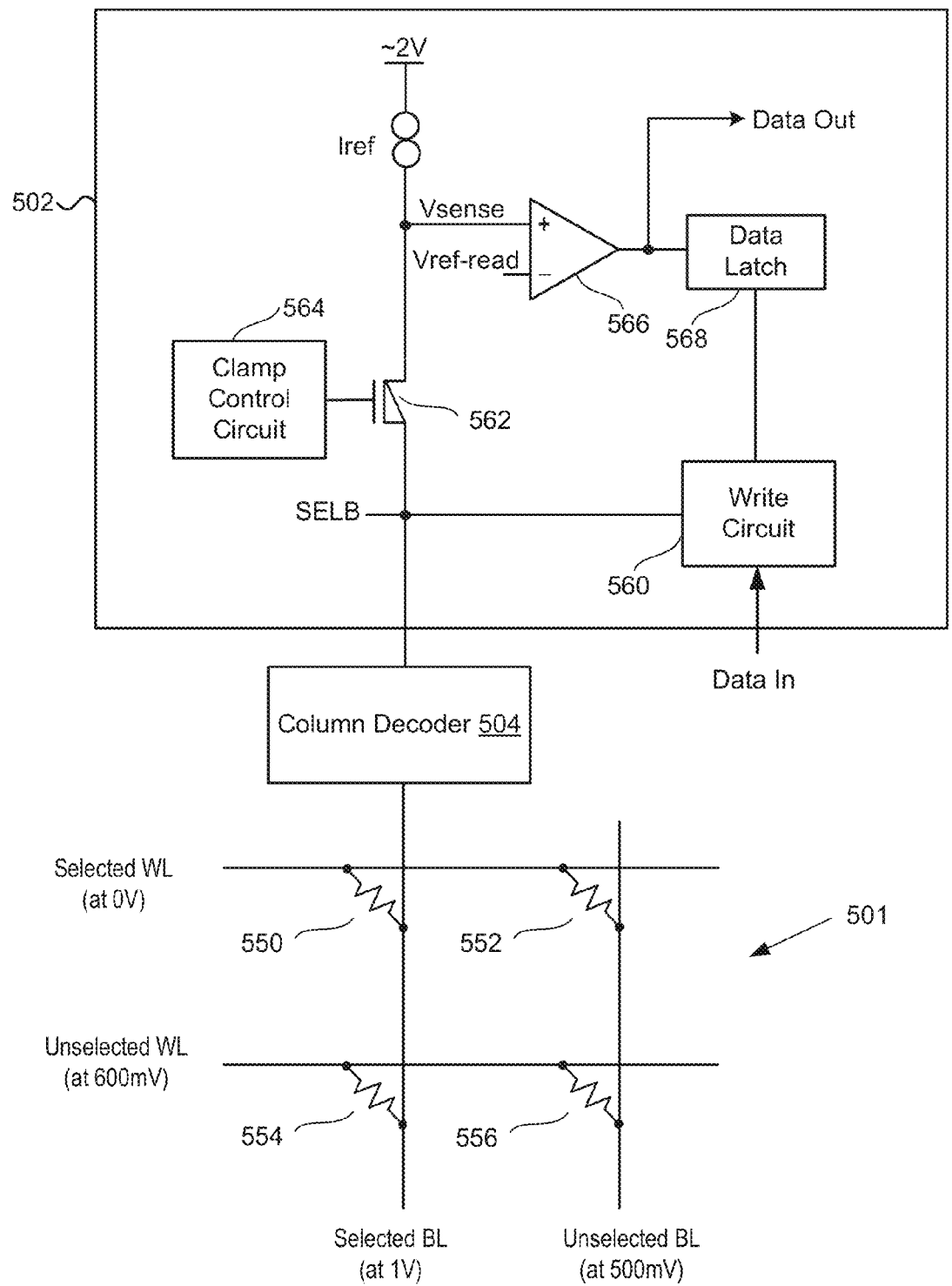
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or -1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
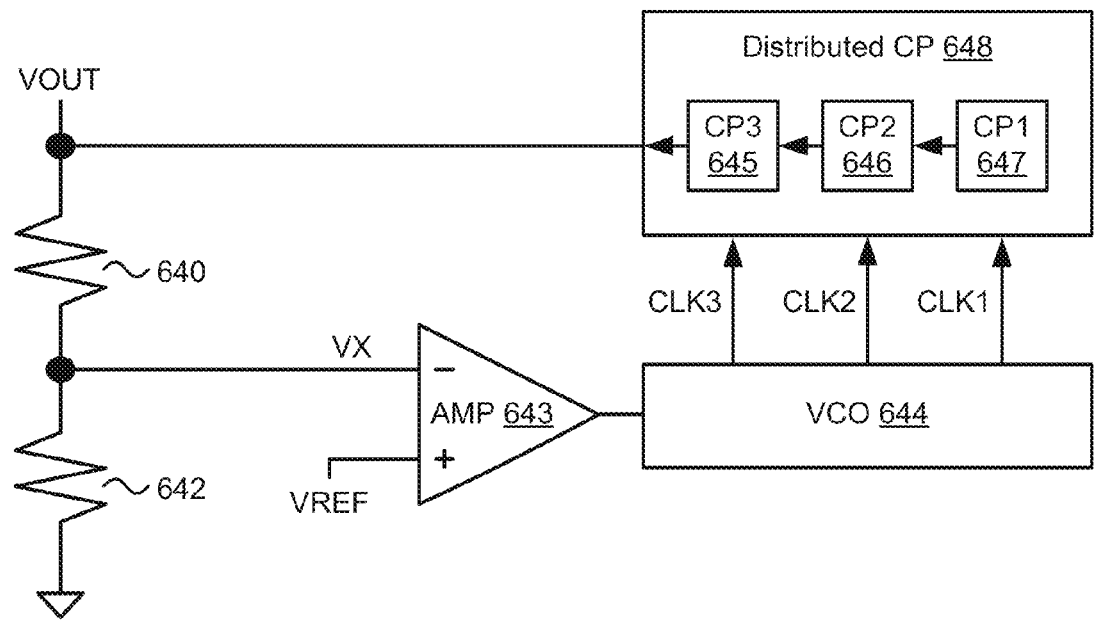
FIG. 6A depicts one embodiment of a voltage generator for generating voltages greater than a provided voltage supply.

FIG. 6A depicts one embodiment of a voltage generator for generating voltages greater than a provided voltage supply (e.g., the provided voltage supply may be provided by an external source or a regulator located outside of a memory chip). The output voltage VOUT may be used as an input voltage to other on-chip voltage regulators in order to provide various voltage references to a memory array (e.g., selected word line voltages, unselected word line voltages, selected bit line voltages, and unselected bit line voltages). As depicted, VREF is used as an input to amplifier AMP 643. Due to closed-loop feedback, the voltage at node VX will be close to (or substantially the same as) VREF and the voltage at node VOUT will be a multiplier higher than the voltage at node VX due to the voltage divider formed by resistors 640 and 642.

The amplifier AMP 643 drives a voltage controlled oscillator VCO 644. VCO 644 generates a plurality of clock signals, such as CLK1, CLK2, and CLK3. The output of amplifier AMP 643 may adjust a frequency of the plurality of clock signals. In one example, if the voltage at node VX is less than the VREF voltage, then the output of amplifier AMP 643 may cause the VCO 644 to increase the frequency of the plurality of clock signals. The VCO 644 drives one or more distributed charge pumps 648 that generate voltages higher than the supply voltage provided. The one or more distributed charge pumps 648 may include one or more pump stages, such as charge pump stages CP1 647, CP2 646, and CP3 645. CP1 647 may be used to boost an input voltage to a first voltage, CP2 646 may be used to boost the first voltage to a second voltage, and CP3 645 may be used to boost the second voltage to the output voltage. Each charge pump stage may include a pair of diodes, a pair of diode-connected transistors, or a pair of charge transfer switches. Resistor and transistor trimming options may be used to modify the resulting output voltage VOUT. The reference voltage VREF may comprise a temperature insensitive reference voltage or a temperature dependent reference voltage. In one embodiment, VREF may be generated using a bandgap voltage reference or be derived from a bandgap-based voltage reference.

Figure 6B:
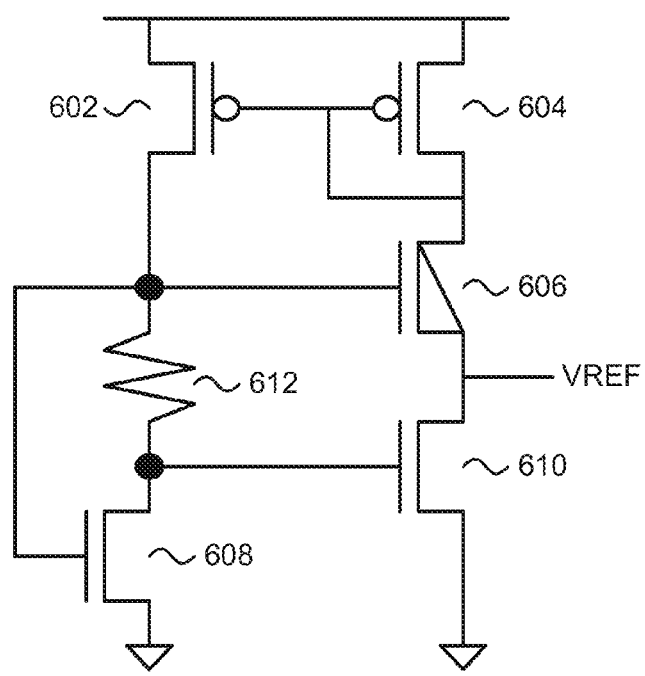
FIG. 6B depicts one embodiment of a voltage reference generator.

FIG. 6B depicts one embodiment of a voltage reference generator including transistors 602-610 and resistor 612 for generating a reference voltage, such as VREF in FIG. 6A. Transistors 608 and 610 comprise nMOS transistors. Transistors 602 and 604 comprise pMOS transistors in a current mirror configuration. Transistor 606 comprises a low VT nMOS transistor. As depicted, the voltage reference generator generates and combines a proportional to absolute temperature (PTAT) voltage and a complementary to absolute temperature (CTAT) voltage based on a difference in transistor VTs between transistor 608 and transistor 606. By modifying the degree to which the PTAT voltage and the CTAT voltage are combined, a resulting output voltage may be created that is either PTAT, CTAT, or substantially independent of temperature. In one embodiment, the devices are sized such that VREF provides a temperature insensitive reference voltage. In another embodiment, the devices are sized such that VREF provides a CTAT voltage. Resistor and transistor trimming options may be used to modify the resulting output voltage and its slope over temperature. One benefit of using a voltage reference generator based on a difference in transistor VTs is that, unlike voltage references based on the base-emitter voltage of a bipolar junction transistor (e.g., a bandgap voltage reference), reference voltages may be generated over a wide range of temperatures using a sub-1V voltage supply. More information regarding voltage reference generation can be found in U.S. Pat. No. 7,999,529, "Methods and Apparatus for Generating Voltage References Using Transistor Threshold Differences."

Figure 7A:
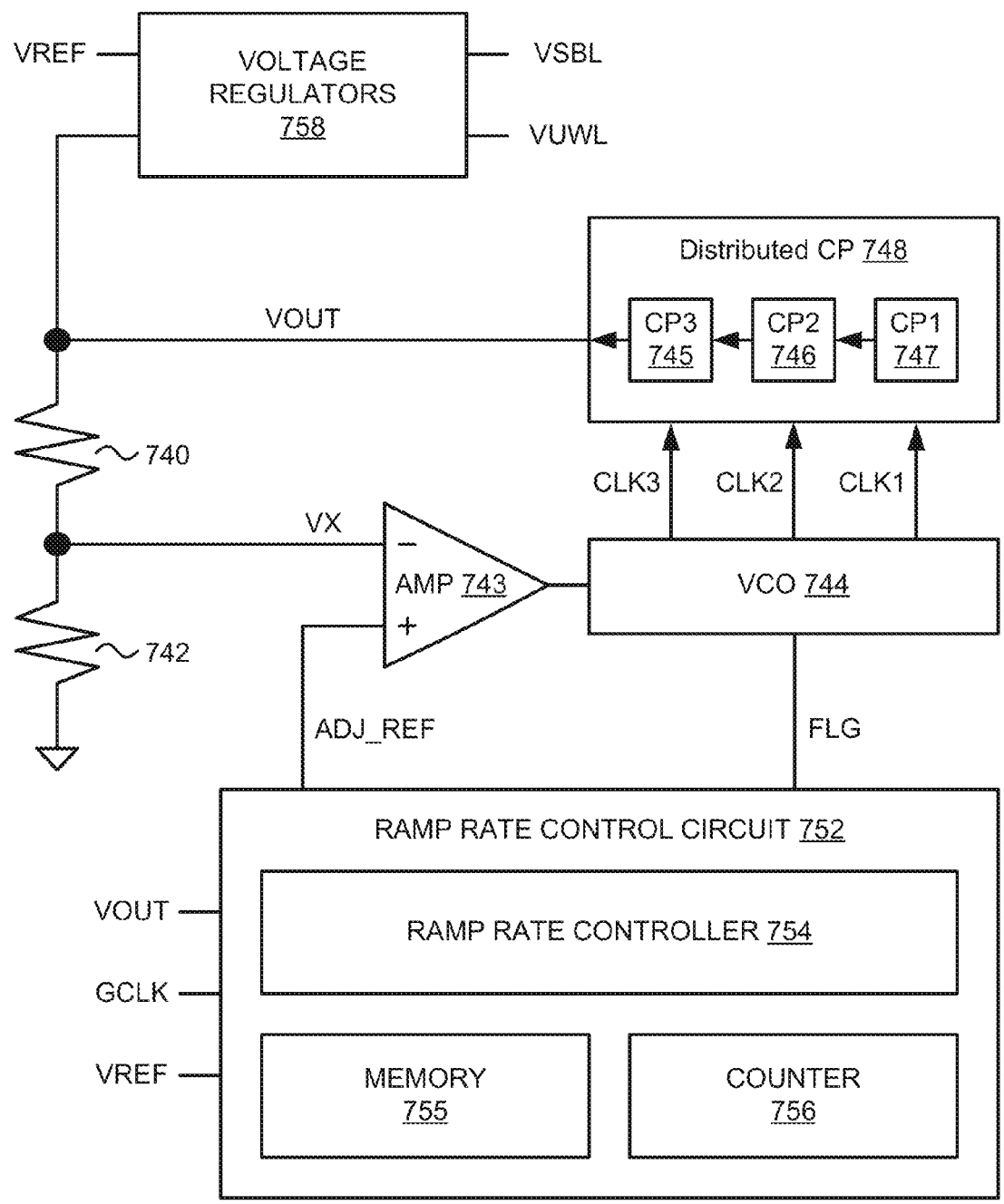
FIG. 7A depicts an alternative embodiment of a voltage generator for generating voltages greater than a provided voltage supply.

FIG. 7A depicts an alternative embodiment of a voltage generator for generating voltages greater than a provided voltage supply (e.g., provided by an external source or a regulator located outside of a memory chip). The output voltage VOUT may be used as an input voltage to other on-chip voltage regulators in order to provide various voltage references to a memory array (e.g., selected word line voltages, unselected word line voltages, selected bit line voltages, and unselected bit line voltages). The various voltage references may include a selected bit line voltage (VSBL) and an unselected word line voltage (VUWL). The various voltage references may be generated using voltage regulators 758 that include a non-inverting amplifier and a unity gain buffer. In one example, the output voltage VOUT may be used to as a power supply for the non-inverting amplifier and the unity gain buffer to generate a regulated voltage. The non-inverting amplifier may include a configurable resistor network (or ladder) that may be configured to generate the regulated voltage before being buffered by the unity gain buffer.

As depicted in FIG. 7A, an adjustable internal reference ADJ_REF may be used as an input to amplifier AMP 743. AMP 743 may comprise a differential amplifier or a comparator. Due to closed-loop feedback, the voltage at node VX will be close to (or substantially the same as) ADJ_REF and the voltage at node VOUT will be a multiplier higher than the voltage at node VX due to the voltage divider formed by resistors 740 and 742. The amplifier AMP 743 drives a voltage controlled oscillator VCO 744. VCO 744 generates a plurality of clock signals, such as CLK1, CLK2, and CLK3. The output of amplifier AMP 743 may adjust a frequency of the plurality of clock signals. In one example, if the voltage at node VX is less than the ADJ_REF voltage, then the output of amplifier AMP 743 may cause the VCO 744 to increase the frequency of the plurality of clock signals. The VCO 744 drives one or more distributed charge pumps 748 that generate voltages higher than the supply voltage provided (e.g., VDD or VCC). The one or more distributed charge pumps 748 may include one or more pump stages, such as charge pump stages CP1 747, CP2 746, and CP3 745. CP1 747 may be used to boost an input voltage (e.g., VDD) to a first voltage, CP2 746 may be used to boost the first voltage to a second voltage greater than the first voltage, and CP3 745 may be used to boost the second voltage to the output voltage VOUT. Each charge pump stage may include a pair of diodes, a pair of diode-connected transistors, or a pair of charge transfer switches. Resistor and transistor trimming options may be used to modify the resulting output voltage VOUT.

As depicted in FIG. 7A, a ramp rate control circuit 752 may generate the adjustable internal reference ADJ_REF and a feedback flag FLG. In one embodiment, the ramp rate control circuit 752 may generate only the feedback flag FLG, which may be used to control VCO 744 such that when the feedback flag signal is asserted the VCO 744 is disabled and the frequency of the plurality of clocks is significantly lowered or stopped. In another embodiment, the ramp rate control circuit 752 may generate only the adjustable internal reference ADJ_REF, which may be used to control the regulation of the output voltage VOUT such that the output voltage VOUT is regulated to a voltage level based on the internal reference ADJ_REF (e.g., VOUT may be regulated to a multiplier higher than the internal reference ADJ_REF based on the voltage divider formed by resistors 740 and 742). In another embodiment, the ramp rate control circuit 752 may generate both the internal reference ADJ_REF and the feedback flag FLG in order to regulate the output voltage VOUT based on a ramp rate schedule.

The ramp rate control circuit 752 may include a ramp rate controller 754, a counter 756, and a memory 755. The memory 755 may comprise a RAM, a ROM, a volatile memory, or a non-volatile memory. The counter 756 may comprise a binary counter. The counter 756 may be used as a timer by counting a number of clock cycles that have occurred since the counter 756 was initialized or reset. The counter 756 may be used to determine a time relative to the beginning of a memory operation, such as a programming operation. The counter 756 may input a global clock signal GCLK, which may comprise a PVT insensitive clock signal (e.g., generated from an on-chip clock oscillator or provided via an external signal). The ramp rate controller 754 may include a state machine and/or other circuitry for determining when to set or adjust the internal reference ADJ_REF and/or when to assert the feedback flag FLG.

In some embodiments, the ramp rate of the output voltage VOUT from the one or more charge pumps 748 may be controlled by the ramp rate control circuit 752 using the counter 756 and a ramp rate schedule stored in the memory 755. The ramp rate schedule may specify varying output voltage levels for the one or more charge pumps 748 during time periods in which the output voltage is charging up from a first voltage to a second voltage greater than the first voltage. In one example, the ramp rate schedule may include a plurality of times, wherein each time of the plurality of times may correspond with a different output voltage level for the one or more charge pumps 748. The ramp rate control circuit 752 may use a comparator to detect that a particular voltage level has been exceeded. The comparator may compare a voltage derived from the output voltage VOUT to a reference voltage VREF in order to determine whether the particular voltage level has been exceeded. The reference voltage VREF may comprise a temperature insensitive reference voltage. In one embodiment, VREF may be generated using a bandgap voltage reference or be derived from a bandgap-based voltage reference. In response to detecting that the particular voltage level has been exceeded, the ramp rate control circuit 752 may assert a feedback flag FLG to disable (or temporarily suspend) the one or more charge pumps 748 from further charging up the output of the one or more charge pumps. In some cases, the ramp rate control circuit 752 may adjust the internal voltage reference ADJ_REF to regulate the output voltage of the one or more charge pumps 748 based on the ramp rate schedule.

Figure 7B:
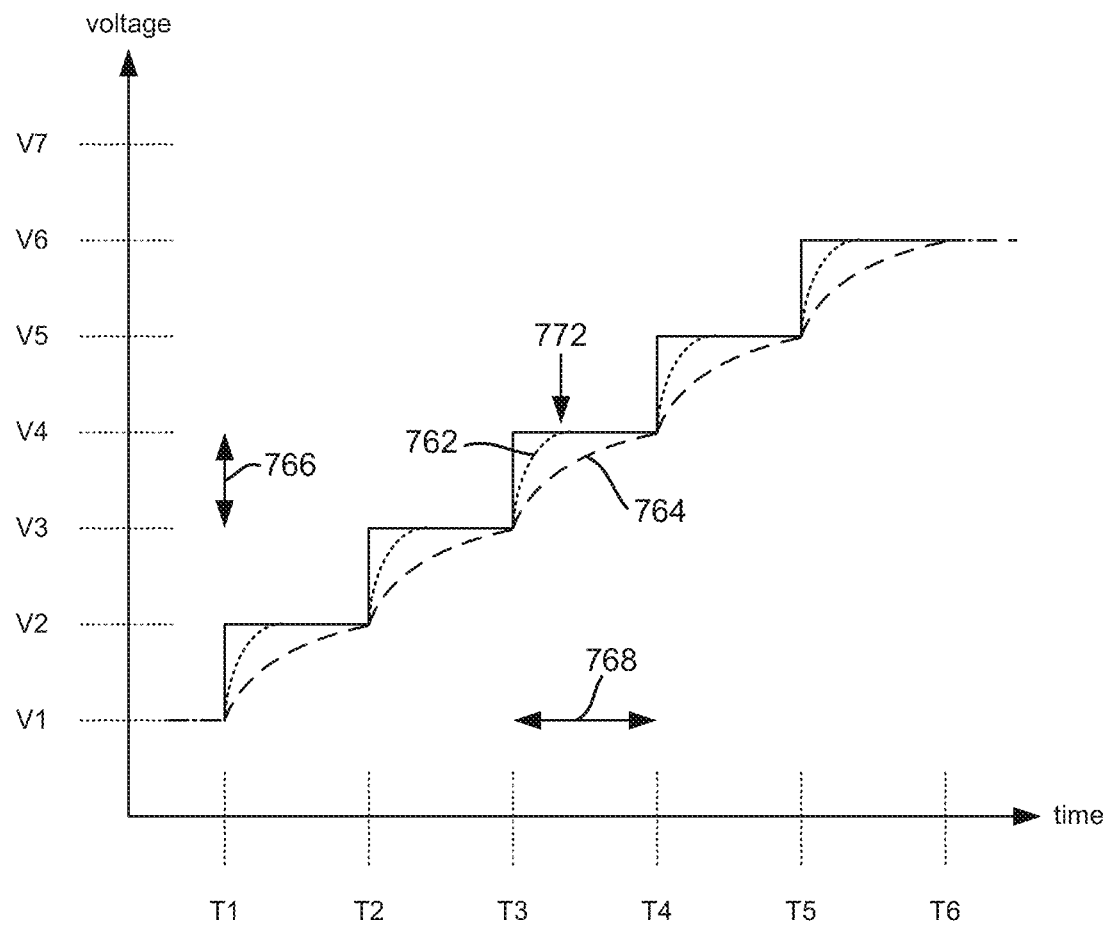
FIGS. 7B-7C depict various embodiments of a ramp rate schedule.

FIG. 7B depicts one embodiment of a ramp rate schedule. The ramp rate schedule may specify varying output voltage levels over a range of charge up times. As depicted, at time T1, the output voltage is set to step up from voltage V1 (e.g., 0V) to voltage V2 (e.g., 3V). At time T2, the output voltage is set to step up from voltage V2 to voltage V3. At time T3, the output voltage is set to step up from voltage V3 to voltage V4. At time T4, the output voltage is set to step up from voltage V4 to voltage V5. At time T5, the output voltage is set to step up from voltage V5 to voltage V6 (e.g., 15V).

The voltage difference between voltage V3 and voltage V4 may comprise a first voltage difference 766. The time difference between time T3 and time T4 may comprise a first time difference 768. In one embodiment, the first voltage difference 766 and the first time difference 768 may both depend on a type of memory operation to be performed on a memory array (e.g., whether the memory operation comprises a programming operation or a read operation). In another embodiment, the first voltage difference 766 and the first time difference 768 may both depend on a process skew associated with an integrated circuit (e.g., whether the integrated circuit has been binned as a fast-NMOS, slow-PMOS device).

As depicted, a ramp rate for a fast voltage output 762 associated with a strong charge pump and/or a light output load is forced to slow down charging up the output voltage at a time 772 prior to time T4. At time T4, the voltage outputs corresponding with both the fast voltage output 762 and a slow voltage output 764 associated with a weak charge pump and/or a heavy output load are aligned or equalized because the fast voltage output 762 is prevented from further charging up the output voltage after the voltage V4 has been reached at time 772.

Figure 7C:
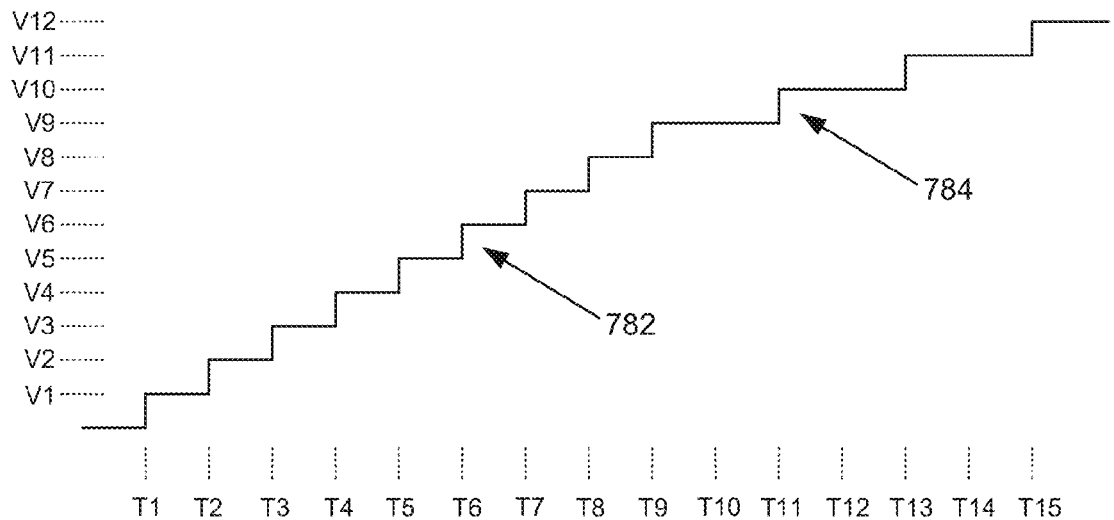

FIG. 7C depicts another embodiment of a ramp rate schedule. In this case, the ramp rate schedule specifies a first ramp rate 782 corresponding with a first slope between times T1 and T9 and a second ramp rate 784 corresponding with a second slope between times T9 and T15. The first slope may be associated with a voltage difference between voltage V1 and voltage V9 divided by a time difference between time T1 and time T9. The second slope may be associated with a voltage difference between voltage V9 and voltage V12 divided by a time difference between time T9 and time T15. In one embodiment, the first slope may be steeper than the second slope. In another embodiment, the second slope may be steeper than the first slope.

In some cases, the output load of a charge pump may change as the output voltage of the charge pump increases. In one example, a load current at the output of the charge pump may increase as the output voltage increases. In this case, the ramp rate of the charge pump may be set to a first slope when charging up the output of the charge pump from a first voltage to a second voltage and then set to a second slope less steep than the first slope when charging up the output of the charge pump from the second voltage to a third voltage in order to compensate for the increased load current.

Figure 7D:
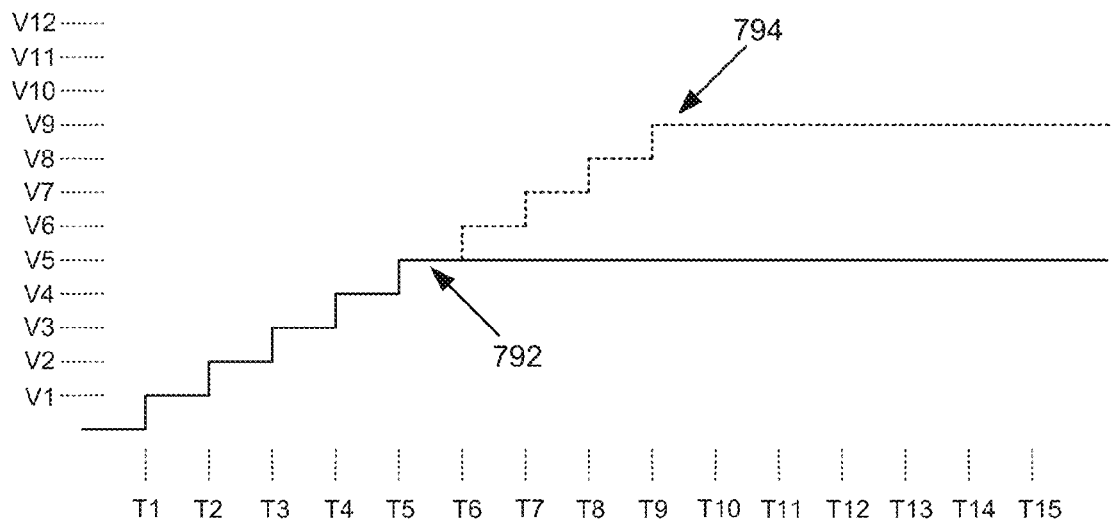
FIG. 7D depicts one embodiment of a first ramp rate schedule and a second ramp rate schedule.

FIG. 7D depicts one embodiment of a first ramp rate schedule and a second ramp rate schedule. The first ramp rate schedule 792 may correspond with a read operation of a memory array. In this case, once the output voltage reaches the voltage V5 at time T5, the output voltage is maintained at voltage V5 (e.g., at 5V). The second ramp rate schedule 794 may correspond with a programming operation of the memory array. In this case, once the output voltage reaches the voltage V9 at time T9, the output voltage is maintained at voltage V9 (e.g., 9V). As depicted, the ramp rates for both the first ramp rate schedule 792 and the second ramp rate schedule 794 may be the same for both the programming operation and the read operation. In some cases, the ramp rate specified for a read operation may be higher (i.e., a faster charge up) than the ramp rate specified for a programming operation.

Figure 8A:
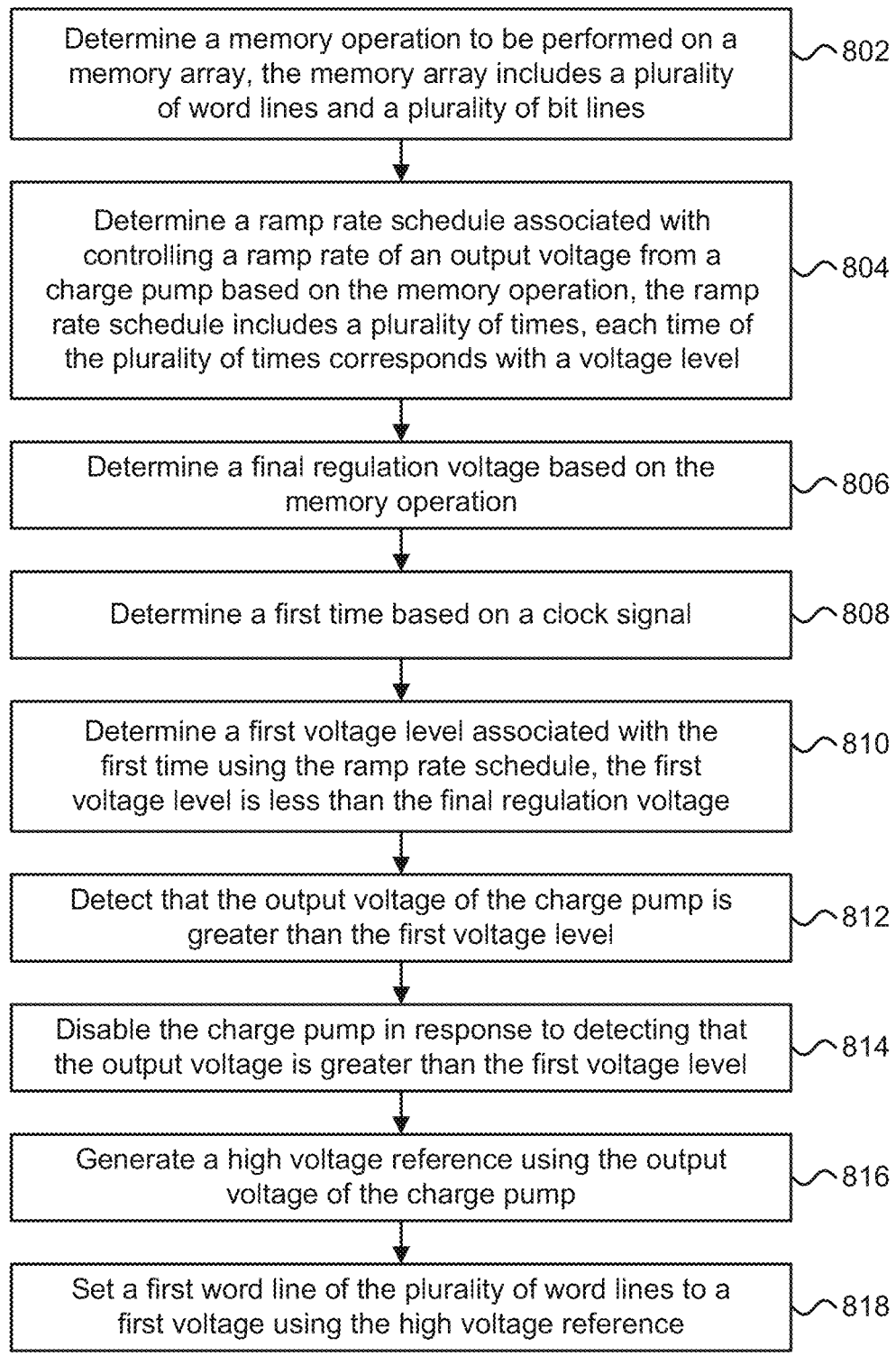
FIG. 8A is a flowchart describing one embodiment of a process for controlling a ramp rate of an output voltage derived from one or more charge pumps.

FIG. 8A is a flowchart describing one embodiment of a process for controlling a ramp rate of an output voltage derived from one or more charge pumps. In one embodiment, the process of FIG. 8A may be performed by ramp rate control circuitry, such as ramp rate control circuit 752 in FIG. 7A.

In step 802, a memory operation to be performed on a memory array is determined. The memory array may comprise a plurality of word lines and a plurality of bit lines. The memory operation may comprise a programming operation, a verify operation, an erase operation, or a read operation. The memory operation may be determined based on a memory command received by a storage system, such as memory system 101 in FIG. 1. In one embodiment, the memory array may comprise a NAND memory array. In another embodiment, the memory array may comprise a three-dimensional memory array.

In step 804, a ramp rate schedule associated with controlling a ramp rate of an output voltage from a charge pump is determined based on the memory operation. The ramp rate schedule may include a plurality of times, wherein each time of the plurality of times may correspond with a different voltage level of a plurality of voltage levels. The ramp rate schedule may be determined by loading configuration information or a lookup table from a non-volatile memory.

In some cases, a clock signal may be acquired or received. The clock signal may comprise a PVT insensitive clock signal that is robust to variations in process, voltage, and temperature. The clock signal may derive from a bandgap-based on-chip clock oscillator. The clock signal may derive from an external clock signal. The external clock signal may derive from a crystal oscillator. The clock signal be associated with a 20 MHz clock signal. The clock signal may include periodic rising edges every 50 ns.

In step 806, a final regulation voltage is determined based on the memory operation. The final regulation voltage may comprise the target regulation voltage at which the output voltage is maintained. The final regulation voltage may correspond with the intended or final voltage level for the output voltage. In one example, if the memory operation is a programming operation, then the final regulation voltage may be set to a voltage level that is necessary to generate other reference voltages, such as a programming voltage. In order to be used as a supply voltage for generating the programming voltage, the final regulation voltage may have to be set to a voltage level that is greater than the programming voltage.

In step 808, a first time is determined based on the clock signal. The first time may be determined using a binary counter, such as counter 756 in FIG. 7A. The first time may correspond with a period of time since a memory operation has started or since an output voltage of the charge pump has started charging up. In step 810, a first voltage level associated with the first time is determined using the ramp rate schedule. The first voltage level may be less than the final regulation voltage. In some cases, the final regulation voltage may be greater than a programming voltage and the first voltage level may be less than the programming voltage.

In step 812, it is detected that the output voltage of the charge pump is greater than the first voltage level. In one embodiment, a comparator may be used to detect that the output voltage of the charge pump is greater than the first voltage level. In step 814, the charge pump is disabled in response to detecting that the output voltage is greater than the first voltage level. In one embodiment, the charge pump may be disabled using a feedback flag, such as feedback flag FLG in FIG. 7A.

In some embodiments, it is detected that the output voltage of the charge pump is greater than the first voltage level prior to the first time and the charge pump may be disabled in response to detecting that the output voltage is greater than the first voltage level prior to the first time. Subsequent to the first time passing, the charge pump may be enabled such that the output voltage continues charging up to the final regulation voltage.

In step 816, a high voltage reference is generated using the output voltage of the charge pump. In one embodiment, the high voltage reference may correspond with a programming voltage or an unselected word line voltage to be applied to one or more control lines of the memory array during the memory operation. In step 818, a first word line of the plurality of word lines is set to a bias voltage using the high voltage reference. In one example, the bias voltage may comprise a programming voltage and the first word line may comprise a selected word line.

Figure 8B:
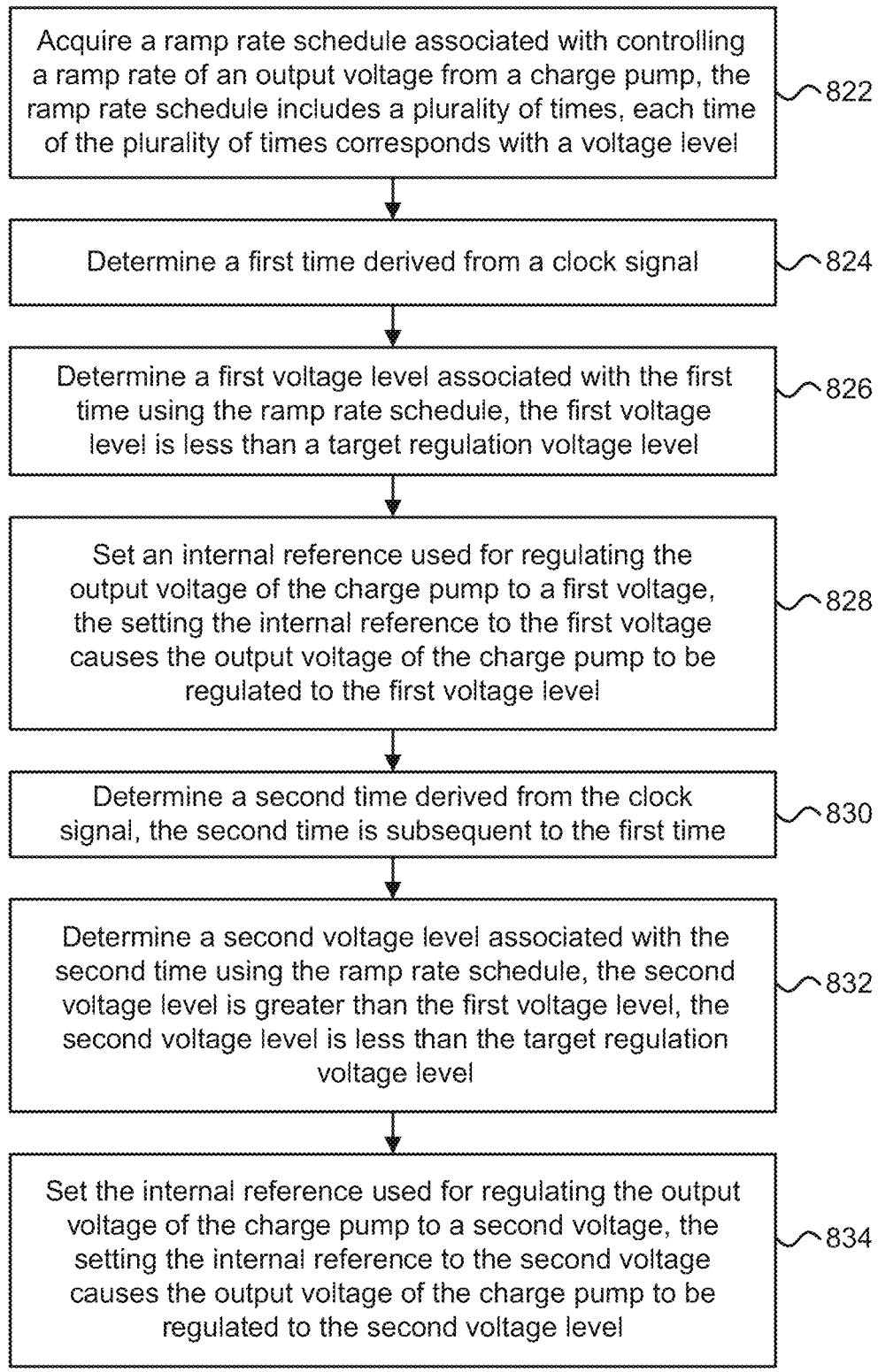
FIG. 8B is a flowchart describing an alternative embodiment of a process for controlling a ramp rate of an output voltage derived from one or more charge pumps.

FIG. 8B is a flowchart describing an alternative embodiment of a process for controlling a ramp rate of an output voltage derived from one or more charge pumps. In one embodiment, the process of FIG. 8B may be performed by a ramp rate control circuit, such as ramp rate control circuit 752 in FIG. 7A.

In step 822, a ramp rate schedule associated with controlling a ramp rate of an output voltage of a charge pump is acquired. The ramp rate schedule may include a plurality of times, wherein each time of the plurality of times may correspond with a voltage level. The ramp rate schedule may be acquired by loading configuration information or a lookup table from a non-volatile memory, such as memory 755 in FIG. 7A.

In step 824, a first time derived from a clock signal is determined. The first time may be determined using a binary counter, such as counter 756 in FIG. 7A. The first time may correspond with a period of time since a memory operation has begun or since an output voltage of the charge pump has begun charging up. The clock signal may comprise a PVT insensitive clock signal that is robust to variations in process, voltage, and temperature. The clock signal may derive from a bandgap-based on-chip clock oscillator. The clock signal may derive from an external clock signal. The external clock signal may derive from a crystal oscillator.

In step 826, a first voltage level associated with the first time is determined using the ramp rate schedule. The first voltage level is less than a target regulation voltage level. The target regulation voltage level may correspond with the target regulation voltage at which the output voltage is maintained. The target regulation voltage level may correspond with the intended or final voltage level for the output voltage of the charge pump. In one example, if a memory operation is a programming operation, then the target regulation voltage level may be set to a voltage level that is necessary to generate other reference voltages, such as a programming voltage. In order to be used as a supply voltage for generating the programming voltage, the target regulation voltage level may have to be set to a voltage level that is greater than the programming voltage.

In step 828, an internal reference used for regulating the output voltage of the charge pump is set to a first voltage. The internal reference may correspond with an internal voltage reference, such as the adjustable internal reference ADJ_REF in FIG. 7A. The setting the internal reference to the first voltage may cause the output voltage of the charge pump to be regulated to the first voltage level. In step 830, a second time subsequent to the first time is determined using the clock signal. The second time may be determined using a binary counter, such as counter 756 in FIG. 7A.

In step 832, a second voltage level associated with the second time is determined using the ramp rate schedule. The second voltage level may be greater than the first voltage level. The second voltage level may be less than the target regulation voltage level. In one example, the target regulation voltage level may comprise a high voltage level (e.g., 15V) and the second voltage level may comprise a middle voltage level less than the high voltage level (e.g., 6V or 8V).

In step 834, the internal reference used for regulating the output voltage of the charge pump is set to a second voltage. The internal reference may correspond with an internal voltage reference, such as the adjustable internal reference ADJ_REF in FIG. 7A. The setting the internal reference to the second voltage may cause the output voltage of the charge pump to be regulated to the second voltage level.

One embodiment of the disclosed technology includes a method for controlling a ramp rate of an output voltage from one or more charge pumps. The method comprises determining a memory operation to be performed on a memory array, determining a final regulation voltage based on the memory operation, and determining a ramp rate schedule associated with controlling the ramp rate of the output voltage from the one or more charge pumps based on the memory operation. The ramp rate schedule specifies a first voltage level associated with a first time. The first voltage level is less than the final regulation voltage. The method further comprises detecting that the output voltage from the one or more charge pumps is greater than the first voltage level prior to the first time and disabling the one or more charge pumps in response to detecting that the output voltage is greater than the first voltage level prior to the first time.

In some cases, the ramp rate schedule may specify a first ramp rate between the first time and a second time subsequent to the first time and a second ramp rate between the second time and a third time subsequent to the second time. The first ramp rate may be greater than the second ramp rate.

One embodiment of the disclosed technology includes one or more charge pumps and a ramp rate control circuit in communication with the one or more charge pumps. The ramp rate control circuit configured to determine a final regulation voltage for the one or more charge pumps and configured to determine a ramp rate schedule associated with controlling a ramp rate of an output voltage from the one or more charge pumps. The ramp rate schedule specifies a first voltage level associated with a first time. The first voltage level is less than the final regulation voltage. The ramp rate control circuit configured to detect that the output voltage from the one or more charge pumps is greater than the first voltage level prior to the first time and configured to disable the one or more charge pumps in response to detecting that the output voltage is greater than the first voltage level prior to the first time.

One embodiment of the disclosed technology includes a method for controlling a ramp rate of an output voltage from one or more charge pumps. The method comprises determining a target regulation voltage level for the output voltage from the one or more charge pumps and acquiring a ramp rate schedule associated with controlling the ramp rate of the output voltage from the one or more charge pumps. The ramp rate schedule specifies a first voltage level associated with a first time and a second voltage level associated with a second time subsequent to the first time. The first voltage level is less than the target regulation voltage level. The second voltage level is less than the target regulation voltage level. The method further comprises setting an internal reference used for regulating the output voltage from the one or more charge pumps to a first internal voltage at the first time. The setting the internal reference to the first internal voltage causes the output voltage from the one or more charge pumps to be regulated to the first voltage level. The method further comprises setting the internal reference used for regulating the output voltage from the one or more charge pumps to a second internal voltage at the second time subsequent to the first time. The setting the internal reference to the second internal voltage causes the output voltage from the one or more charge pumps to be regulated to the second voltage level. The method further comprises setting the internal reference used for regulating the output voltage of the one or more charge pumps to a third internal voltage at a third time subsequent to the second time. The setting the internal reference to the third internal voltage causes the output voltage from the one or more charge pumps to be regulated to the target regulation voltage level.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for controlling a ramp rate of an output voltage from one or more charge pumps, comprising:
   determining a memory operation to be performed on a memory array;
   determining a final regulation voltage based on the memory operation;
   determining a ramp rate schedule associated with controlling the ramp rate of the output voltage from the one or more charge pumps based on the memory operation, the ramp rate schedule specifies a first voltage level associated with a first time, the first voltage level is less than the final regulation voltage;
   detecting that the output voltage from the one or more charge pumps is greater than the first voltage level prior to the first time; and
   disabling the one or more charge pumps in response to detecting that the output voltage is greater than the first voltage level prior to the first time, wherein disabling the one or more charge pumps includes preventing the one or more charge pumps from increasing the output voltage above the first voltage level less than the final regulation voltage.

2. The method of claim 1, further comprising:
   detecting that the output voltage from the one or more charge pumps is less than a second voltage level prior to a second time subsequent to the first time, the ramp rate schedule specifies the second voltage level associated with the second time, the second voltage level is less than the final regulation voltage; and
   enabling the one or more charge pumps in response to detecting that the output voltage is less than the second voltage level prior to the second time.

3. The method of claim 1, wherein:
   the detecting that the output voltage from the one or more charge pumps is greater than the first voltage level prior to the first time includes determining a time duration since the output voltage from the one or more charge pumps started charging up from an initial voltage and comparing the output voltage from the one or more charge pumps to the first voltage level.

4. The method of claim 1, wherein:
   the ramp rate schedule specifies a first ramp rate between the first time and a second time subsequent to the first time and a second ramp rate between the second time and a third time subsequent to the second time.

5. The method of claim 4, wherein:
   the first ramp rate is greater than the second ramp rate.

6. The method of claim 1, wherein:
the memory operation comprises a programming operation; and
the disabling the one or more charge pumps includes disabling clocking of the one or more charge pumps.

7. A system, comprising:
one or more charge pumps; and
a ramp rate control circuit configured to determine a final regulation voltage for the one or more charge pumps, the ramp rate control circuit configured to determine a ramp rate schedule associated with controlling a ramp rate of an output voltage from the one or more charge pumps, the ramp rate schedule specifies a first voltage level associated with a first time, the first voltage level is less than the final regulation voltage, the ramp rate control circuit configured to detect that the output voltage from the one or more charge pumps is greater than the first voltage level prior to the first time, the ramp rate control circuit configured to prevent the one or more charge pumps from increasing the output voltage above the first voltage level less than the final regulation voltage in response to detection that the output voltage is greater than the first voltage level prior to the first time.

8. The system of claim 7, wherein:
the ramp rate control circuit configured to detect that the output voltage from the one or more charge pumps is less than a second voltage level prior to a second time subsequent to the first time, the ramp rate schedule specifies the second voltage level associated with the second time, the second voltage level is less than the final regulation voltage, the ramp rate control circuit configured to enable the one or more charge pumps in response to detection that the output voltage is less than the second voltage level prior to the second time.

9. The system of claim 7, wherein:
the ramp rate control circuit configured to determine a time duration since the output voltage from the one or more charge pumps started charging up from an initial voltage, the ramp rate control circuit configured to compare the output voltage from the one or more charge pumps to the first voltage level.

10. The system of claim 7, wherein:
the ramp rate control circuit configured to determine a number of clock cycles that have occurred since the output voltage from the one or more charge pumps started charging up from an initial voltage.

11. The system of claim 10, wherein:
the ramp rate control circuit configured to acquire a clock signal and determine the number of clock cycles that have occurred since the output voltage from the one or more charge pumps started charging up from the initial voltage using the clock signal.

12. The system of claim 7, wherein:
the ramp rate schedule specifies a first ramp rate between the first time and a second time subsequent to the first time and a second ramp rate between the second time and a third time subsequent to the second time.

13. The system of claim 12, wherein:
the first ramp rate is greater than the second ramp rate.

14. The system of claim 7, wherein:
the ramp rate control circuit configured to determine a memory operation to be performed on a memory array, the ramp rate control circuit configured to determine the final regulation voltage based on the memory operation.

15. The system of claim 7, wherein:
the memory operation comprises a programming operation; and
the memory array comprises a three-dimensional memory array.

16. The system of claim 7, wherein:
the ramp rate control circuit is configured to disable clocking of the one or more charge pumps in response to detection that the output voltage is greater than the first voltage level prior to the first time.

17. An apparatus, comprising:
one or more charge pumps;
a memory configured to store a ramp rate schedule associated with controlling a ramp rate of an output voltage from the one or more charge pumps, the ramp rate schedule specifies a first voltage level associated with a first time, the first voltage level is less than a final regulation voltage for the one or more charge pumps; and
a ramp rate controller configured to determine the final regulation voltage for the one or more charge pumps and detect that the output voltage from the one or more charge pumps is greater than the first voltage level prior to the first time, the ramp rate controller configured to prevent the one or more charge pumps from increasing the output voltage above the first voltage level which is less than the final regulation voltage in response to detection that the output voltage is greater than the first voltage level prior to the first time.

18. The apparatus of claim 17, wherein:
the ramp rate controller configured to detect that the output voltage from the one or more charge pumps is less than a second voltage level prior to a second time subsequent to the first time, the ramp rate schedule specifies the second voltage level associated with the second time, the second voltage level is less than the final regulation voltage, the ramp rate controller configured to enable the one or more charge pumps in response to detection that the output voltage is less than the second voltage level prior to the second time.

19. The apparatus of claim 17, wherein:
the ramp rate schedule specifies a first ramp rate between the first time and a second time subsequent to the first time and a second ramp rate between the second time and a third time subsequent to the second time, the first ramp rate is different from the second ramp rate.

20. The apparatus of claim 17, wherein:
the ramp rate controller configured to freeze clocking of the one or more charge pumps in response to detection that the output voltage is greater than the first voltage level prior to the first time.

* * * * *